US008989405B2

(12) United States Patent
Nakamura

(10) Patent No.: US 8,989,405 B2
(45) Date of Patent: Mar. 24, 2015

(54) AUDIO SIGNAL CORRECTION APPARATUS, AUDIO SIGNAL CORRECTION METHOD, AND AUDIO SIGNAL CORRECTION PROGRAM

(75) Inventor: Masami Nakamura, Yokohama (JP)

(73) Assignee: JVC KENWOOD Corporation, Kanagawa-Ken (JP)

( * ) Notice: Subject to any disclaimer, the term of this patent is extended or adjusted under 35 U.S.C. 154(b) by 373 days.

(21) Appl. No.: 13/346,256

(22) Filed: Jan. 9, 2012

(65) Prior Publication Data

US 2012/0177220 A1 Jul. 12, 2012

(30) Foreign Application Priority Data

Jan. 11, 2011 (JP) ................................ 2011-003403

(51) Int. Cl.
*H03G 7/00* (2006.01)
*H03G 3/00* (2006.01)
*G10L 21/02* (2013.01)
*G10L 19/008* (2013.01)
*G10L 19/025* (2013.01)

(52) U.S. Cl.
CPC ............... *G10L 21/02* (2013.01); *G10L 19/008* (2013.01); *G10L 19/025* (2013.01)
USPC .......................................... 381/106; 381/104

(58) Field of Classification Search
USPC ........... 381/61, 1, 17, 18, 303, 307, 104, 106, 381/107
See application file for complete search history.

(56) References Cited

U.S. PATENT DOCUMENTS

| | | | | |
|---|---|---|---|---|
| 4,405,831 | A * | 9/1983 | Michelson | 381/317 |
| 5,883,962 | A * | 3/1999 | Hawks | 381/1 |
| 7,353,169 | B1 * | 4/2008 | Goodwin et al. | 704/224 |
| 2004/0190734 | A1 * | 9/2004 | Kates | 381/106 |
| 2006/0285369 | A1 * | 12/2006 | Na | 363/21.07 |
| 2008/0082189 | A1 | 4/2008 | Kuwaoka | |
| 2008/0212795 | A1 * | 9/2008 | Goodwin et al. | 381/94.2 |

FOREIGN PATENT DOCUMENTS

| | | |
|---|---|---|
| JP | 2007-36710 | 2/2007 |
| JP | 2010-219836 | 9/2010 |

OTHER PUBLICATIONS

European Search Report (Application No. 12150803.0-1224) (5 pages—dated Mar. 27, 2012).

* cited by examiner

*Primary Examiner* — Vivian Chin
*Assistant Examiner* — William A Jerez Lora
(74) *Attorney, Agent, or Firm* — Renner, Kenner, Greive, Bobak, Taylor & Weber

(57) ABSTRACT

A first differential value is acquired between first current data and first previous data in an i number (i being a natural number) of sampling periods before the current data. A second differential value is acquired between second current data and second previous data in a j number (j being a natural number) of sampling periods before the current data. Both first data and both second data are of a first and a second digital audio signal, respectively, having a sound level of a digital stereo audio signal in the left and right channels, respectively. A first and a second correction coefficient are acquired by adding the first and second differential values at a first and a second ratio, respectively. The first signal is corrected by multiplying the first signal by the first correction coefficient. The second signal is corrected by multiplying the second signal by the second correction coefficient.

9 Claims, 8 Drawing Sheets

AUDIO SIGNAL CORRECTION APPARATUS, AUDIO SIGNAL CORRECTION METHOD, AND AUDIO SIGNAL CORRECTION PROGRAM

CROSS-REFERENCE TO RELATED APPLICATIONS

This application is based on and claims the benefit of priority from the prior Japanese Patent Application No. 2011-003403 filed on Jan. 11, 2011, the entire content of which is incorporated herein by reference.

BACKGROUND OF THE INVENTION

The present invention relates to an audio signal correction apparatus, an audio signal correction method, and an audio signal correction program.

An impulsive sound (referred to as an attack sound, hereinafter) produced by hitting a percussion instrument, such as a drum, has a sound level that rises steeply and varies instantaneously. When such an attack sound is recorded once and then reproduced through a speaker, it may happen that a speaker cone does not vibrate instantaneously at the timing at which the attack sound was produced, a reproduced audio signal is deteriorated with slow rise-up of a sound level. This may result in that a reproduced sound is heard with a mild tone and slower rise-up of a sound level than an attack sound.

The cause of such a phenomenon may be a smaller number of windings of a coil of a speaker, the deformation of a cone of a speaker, a quantization error in digitalization of audio signals, the cut-off of high-frequency components in digital compression of audio signals, etc.

SUMMARY OF THE INVENTION

A purpose of the present invention is to provide an audio signal correction apparatus, an audio signal correction method, and an audio signal correction program that achieve the correction of an audio signal that involves an attack sound deteriorated due to digitalization or compression into an audio signal close to an original audio signal.

The present invention provides an audio signal correction apparatus comprising: a first differential-value acquisition circuit configured to acquire a first differential value between first current input data and first previous input data in an i number (i being a natural number) of sampling periods before the first current input data, both first input data being of a first digital audio signal that has a sound level of a digital stereo audio signal in a left channel; a second differential-value acquisition circuit configured to acquire a second differential value between second current input data and second previous input data in a j number (j being a natural number) of sampling periods before the second current input data, both second input data being of a second digital audio signal that has a sound level of the digital stereo audio signal in a right channel; a correction coefficient acquisition circuit configured to acquire a first correction coefficient by adding the first and second differential values at a first ratio and acquire a second correction coefficient by adding the first and second differential values at a second ratio; and a correction circuit configured to correct the first digital audio signal by multiplying the first digital audio signal by the first correction coefficient and correct the second digital audio signal by multiplying the second digital audio signal by the second correction coefficient.

Moreover, the present invention provides an audio signal correction method comprising: a first differential-value acquisition step of acquiring a first differential value between first current input data and first previous input data in an i number (i being a natural number) of sampling periods before the first current input data, both first input data being of a first digital audio signal that has a sound level of a digital stereo audio signal in a left channel; a second differential-value acquisition step of acquiring a second differential value between second current input data and second previous input data in a j number (j being a natural number) of sampling periods before the second current input data, both second input data being of a second digital audio signal that has a sound level of the digital stereo audio signal in a right channel; a correction coefficient acquisition step of acquiring a first correction coefficient by adding the first and second differential values at a first ratio and acquiring a second correction coefficient by adding the first and second differential values at a second ratio; and a correction step of correcting the first digital audio signal by multiplying the first digital audio signal by the first correction coefficient and correcting the second digital audio signal by multiplying the second digital audio signal by the second correction coefficient.

Furthermore, the present invention provides an audio signal correction program stored in a non-transitory computer readable device, the program comprising: a first differential-value acquisition program code of acquiring a first differential value between first current input data and first previous input data in an i number (i being a natural number) of sampling periods before the first current input data, both first input data being of a first digital audio signal that has a sound level of a digital stereo audio signal in a left channel; a second differential-value acquisition program code of acquiring a second differential value between second current input data and second previous input data in a j number (j being a natural number) of sampling periods before the second current input data, both second input data being of a second digital audio signal that has a sound level of the digital stereo audio signal in a right channel; a correction coefficient acquisition program code of acquiring a first correction coefficient by adding the first and second differential values at a first ratio and acquiring a second correction coefficient by adding the first and second differential values at a second ratio; and a correction program code of correcting the first digital audio signal by multiplying the first digital audio signal by the first correction coefficient and correcting the second digital audio signal by multiplying the second digital audio signal by the second correction coefficient.

DETAILED DESCRIPTION OF PREFERRED EMBODIMENTS

Embodiment of Audio Reproduction Apparatus

An embodiment of an audio reproduction apparatus having an audio-signal correction function (for example, an attack-sound emphasizing function) according to the present invention will be explained with reference to FIG. 1.

It is a precondition in the following description that an audio reproduction apparatus, an embodiment of the present invention, is installed in, for example: a receiving apparatus for digital television broadcasting, to process a signal compressed by AAC (Advanced Audio Coding) so that signal components of 16 KHz or higher are cut off; or a portable terminal, to process a signal compressed by MP3 (MPEG audio layer-3) so that signal components of 8 KHz or higher are cut off.

Figure 1:
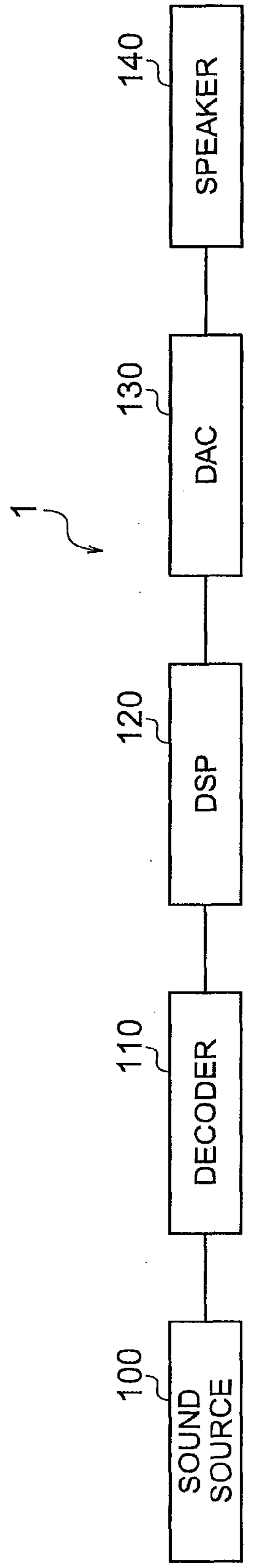
FIG. 1 is a block diagram of an audio reproduction apparatus according to an embodiment of the present invention.

As shown in FIG. 1, an audio reproduction apparatus 1, an embodiment of the present invention, is provided with a sound source 100, a decoder 110, a DSP (Digital Signal Processor) 120, a DAC (Digital Analog Converter) 130, and a speaker 140.

The sound source 100 is: a receiving apparatus for digital television broadcasting to output a signal encoded by AAC so that signal components of 16 KHz or higher are cut off; or a MP player to output a signal encoded by MP3 so that signal components of 8 KHz or higher are cut off. Accordingly, the sound source 100 outputs lossy-compressed audio data having high-frequency components cut off. Especially, in this embodiment, the sound source 100 outputs lossy-compressed audio data in the left and right channels.

The decoder 110 is compatible with a compression technique, such as MC or MP3. The decoder 110 decompresses lossy-compressed audio data in the left and right channels supplied from the sound source 100 with a decompression technique corresponding to AAC or MP3, to convert the audio data into PCM (Pulse Code Modulation) digital audio signals in the left and right channels having high-frequency components cut off. The decompressed digital audio signals in the left and right channels are output to the DSP 120.

The DSP 120 is a processing unit for digital signal processing. In this embodiment, the DSP 120 corrects digital audio signals in the left and right channels decompressed by the decoder 110 into digital audio signal data in the left and right channels having attack sound emphasized. The corrected digital audio signal data in the left and right channels is output to the DAC 130.

The DAC 130 is a converter to convert a digital audio signal into an analog audio signal. In this embodiment, the DAC 130 converts the corrected digital audio signal data in the left and right channels supplied from the DSP 120 into analog audio signals. The analog audio signals are output to the speaker 140 that gives off sounds.

The DSP120 is explained in detail with reference to FIG. 2.

The DSP120 processes a digital stereo audio signal having a digital audio signal SL in the left (L) channel and a digital audio signal SR in the right (R) channel.

Concerning the digital audio signal SL in the left (L) channel, the DSP120 is provided with: a buffer 111 that multiplies data (a fragment of a signal) of an input L-channel audio signal SLin by 1; a buffer 112 that multiplies the output signal of a delay element 113 by −1; the delay element 113 that delays the input L-channel audio signal SLin by one sampling period to output a signal sampled in the period that is one sampling period before the current sampling period; an adder 114 that adds the output signals of the buffers 111 and 112; an absolute value circuit 115 that takes the absolute value of the output signal of the adder 114; multipliers 116 and 117 that amplify the output signal of the absolute value circuit 115 at a specific constant ratio; an adder 118 that adds the output signal of the multiplier 116 and the output signal of a multiplier 127 in the right channel which will be described later; and a multiplier 119 that multiplies the input L-channel audio signal SLin by the output signal of the multiplier 127, to output an L-channel corrected output signal SLout.

The elements that constitute the DSP120 in the left channel will be described in detail.

It is defined in the following description that data SL(t) is a fragment of the input L-channel audio signal SLin sampled in a sampling period t and data SL(t−1) is a fragment of the input L-channel audio signal SLin sampled in the period that is one sampling period before the sampling period t for the data SL(t).

In accordance with the definition, when the L-channel audio signal SLin is input, the buffer 111 outputs the data SL(t). The buffer 112 multiplies output data SL(t−1) of the delay element 113 by −1 to output data −SL(t−1). The delay element 113 delays the input L-channel audio signal SL by one sampling period to output the data SL(t−1) sampled in the period that is one sampling period before the sampling period t for the data SL(t).

The adder 114 adds the output data SL(t) of the buffer 111 and the output data −SL(t−1) of the buffer 112, to output data (a differential value) SL(t)−SL(t−1). The absolute value circuit 115 takes the absolute value of the output data SL(t)−SL(t−1) of the adder 114 to output data $|(SL(t)-SL(t-1)|$.

The multiplier 116 multiplies the output data $|SL(t)-SL(t-1)|$ of the absolute value circuit 115 by a specific multiplier A to output data $A\cdot|SL(t)-SL(t-1)|$. The multiplier 117 multiplies the output data $|SL(t)-SL(t-1)|$ of the absolute value circuit 115 by a specific multiplier B to output data $B\cdot|SL(t)-SL(t-1)|$. It is preferable that the multiplier A is larger than the multiplier B.

The adder 118 adds, by weighted addition, the output data $A\cdot|SL(t)-SL(t-1)|$ of the multiplier 116 and output data $B\cdot|SR(t)-SR(t-1)|$ of the multiplier 127 in the right channel which will be described later, to output data (a correction coefficient) $A\cdot|SL(t)-SL(t-1)|+B\cdot|SR(t)-SR(t-1)|$.

The multiplier 119 multiplies the data SL(t) and the output data $A\cdot|SL(t)-SL(t-1)|+B\cdot|SR(t)-SR(t-1)|$ of the adder 118 to correct the data SL(t) to output corrected data $SL(t)\cdot\{A\cdot|SL(t)-SL(t-1)|+B\cdot|SR(t)-SR(t-1)|\}$ that is the output data of the DSP 120 in the left channel.

Next, concerning the digital audio signal SR in the right (R) channel, the DSP120 is provided with: a buffer 121 that multiplies data (a fragment of a signal) of an input R-channel audio signal SRin by 1; a buffer 122 that multiplies the output signal of a delay element 123 by −1; the delay element 123 that delays the input R-channel audio signal SRin by one sampling period to output a signal sampled in the period that is one sampling period before the current sampling period; an adder 124 that adds the output signals of the buffers 121 and 122; an absolute value circuit 125 that takes the absolute value of the output signal of the adder 124; multipliers 126 and 127 that amplify the output signal of the absolute value circuit 125 at a specific constant ratio; an adder 128 that adds the output signal of the multiplier 126 and the output signal of the multiplier 117 in the left channel; and a multiplier 129 that multiplies the input R-channel audio signal SRin by the output signal of the adder 128, to output a R-channel corrected output signal SRout.

The elements that constitute the DSP120 in the right channel will be described in detail.

It is defined in the following description that data SR(t) is a fragment of the input R-channel audio signal SRin sampled in a sampling period t and data SR(t−1) is a fragment of the input R-channel audio signal SRin sampled in the period that is one sampling period before the sampling period t for the data SR(t).

In accordance with the definition, when the R-channel audio signal SRin is input, the buffer 121 outputs the data SR(t). The buffer 122 multiplies output data SR(t−1) of the delay element 123 by −1 to output data −SR(t−1). The delay element 123 delays the input R-channel audio signal SR by one sampling period to output the data SR(t−1) sampled in the period that is one sampling period before the sampling period t for the data SR(t).

The adder 124 adds the output data SR(t) of the buffer 121 and the output data −SR(t−1) of the buffer 122, to output data (a differential value) SR(t)−SR(t−1). The absolute value circuit 125 takes the absolute value of the output data SR(t)−SR(t−1) of the adder 124 to output data |SR(t)−SR(t−1)|.

The multiplier 126 multiplies the output data |SR(t)−SR(t−1)| of the absolute value circuit 125 by the multiplier A to output data A·SR(t)−SR(t−1)|. The multiplier 127 multiplies the output data |SR(t)−SR(t−1)| of the absolute value circuit 125 by the multiplier B to output data B·|SR(t)−SR(t−1)|.

The adder 128 adds, by weighted addition, the output data A·|SR(t)−SR(t−1)| of the multiplier 126 and output data B·|SL(t)−SL(t−1)| of the multiplier 117 in the left channel, to output data (a correction coefficient) A·|SR(t)−SR(t−1)|+B·SL(t)−SL(t−1)|.

The multiplier 129 multiplies the data SR(t) and the output data A·|SR(t)−SR(t−1)|+B·|SL(t)−SL(t−1)| of the adder 128 to correct the data SR(t) to output corrected data SR(t) · {A·|SR(t)−SR(t−1)|+B·|SL(t)−SL(t−1)|} that is the output data of the DSP 120 in the right channel.

Figure 2:
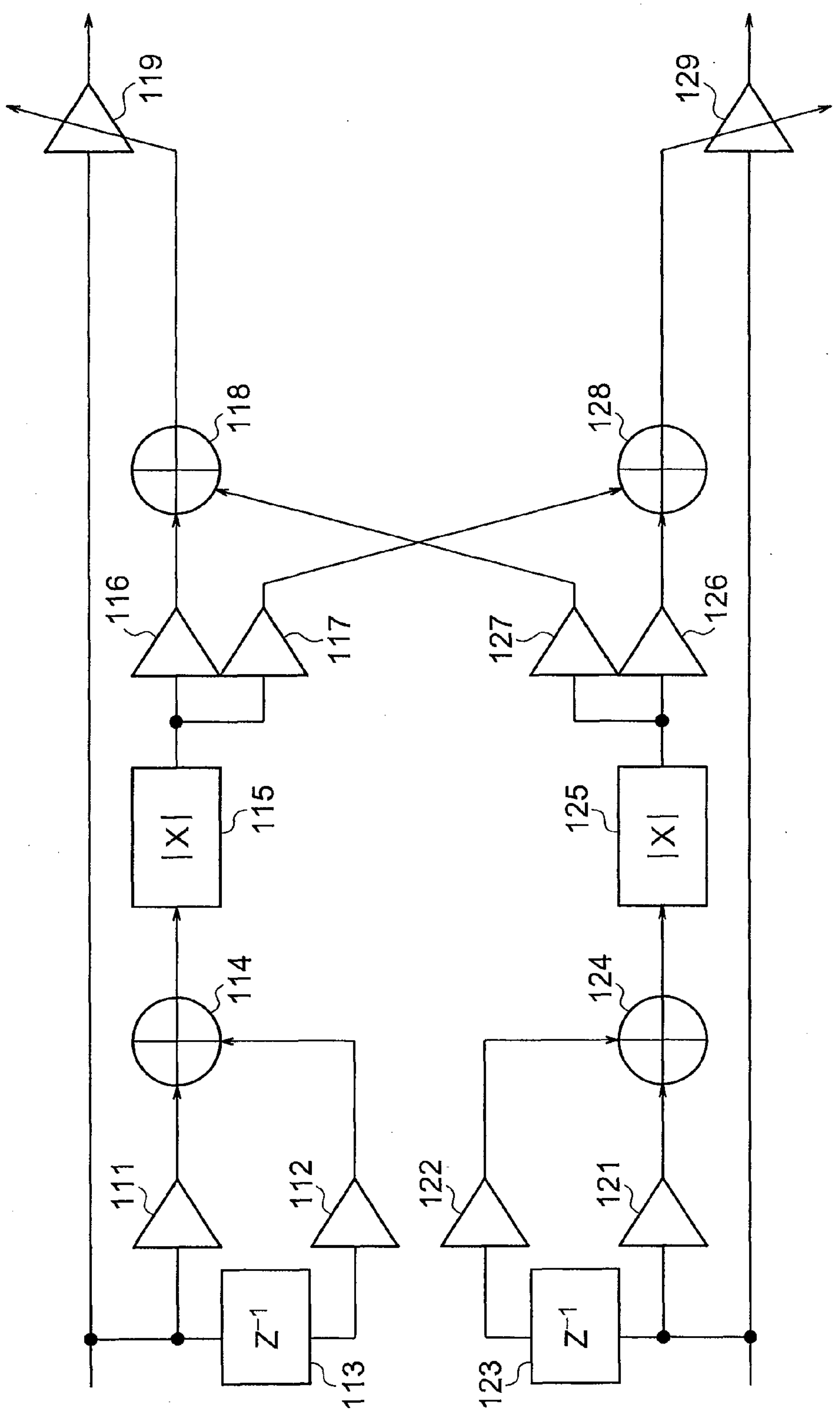
FIG. 2 is an exemplary block diagram of a DSP of the audio reproduction apparatus shown in FIG. 1.

In FIG. 2, the buffers 111 and 112, the delay element 113, and the adder 114 constitute a first differential-value acquisition circuit that acquires a first differential value SL(t)−SL(t−1) between first current input data SL(t) and first previous input data SL(t−1) in an i number (i being a natural number, that is t in the embodiment) of sampling periods before the first current input data SL(t), both first input data SL(t) and SL(t−1) being of a first digital audio signal SLin that has a sound level of a digital stereo audio signal in the left channel.

Also, in FIG. 2, the buffers 121 and 122, the delay element 123, and the adder 124 constitute a second differential-value acquisition circuit that acquires a second differential value SR(t)−SR(t−1) between second current input data SR(t) and second previous input data SR(t−1) in a j number (j being a natural number, that is t in the embodiment) of sampling periods before the second current input data, both second input data SR(t) and SR(t−1) being of a second digital audio signal SRin that has a sound level of the digital stereo audio signal in the right channel.

Moreover, in FIG. 2, the absolute value circuits 115 and 125, the multipliers 116, 117, 126 and 127, and the adders 118 and 128 constitute a correction coefficient acquisition circuit that acquires a first correction coefficient A·|SL(t)−SL(t−1)|+B·|SR(t)−SR(t−1)| by adding the first and second differential values SL(t)−SL(t−1) and SR(t)−SR(t−1) at a first ratio (the multiplier A:B, A>B) and acquires a second correction coefficient A·|SR(t)−SR(t−1)|+B·|SL(t)−SL(t−1)| by adding the first and second differential values SL(t)−SL(t−1) and SR(t)−SR(t−1) at a second ratio (B:A).

Furthermore, in FIG. 2, multipliers 119 and 129 constitute a correction circuit that corrects the first digital audio signal SLin by multiplying the first digital audio signal SLin by the first correction coefficient A·|SL(t)−SL(t−1)|+B·|SR(t)−SR(t−1)| and corrects the second digital audio signal SRin by multiplying the second digital audio signal SRin by the second correction coefficient A·|SR(t)−SR(t−1)|+B·|SL(t)−SL(t−1)|.

Described next is an operation of the audio reproduction apparatus 1 shown in FIG. 1.

The sound source 100 outputs to the decoder 110 L- and R-channel lossy-compressed audio data having high-frequency components cut off. The decoder 110 decodes the L- and R-channel lossy-compressed audio data into decompressed L- and R-channel digital audio signals having high-frequency components cut off. The L- and R-channel digital audio signals are then input to the DSP120.

The DSP120 corrects the L- and R-channel digital audio signals with attack-sound emphasis to output attack-sound-emphasized L- and R-channel digital audio signals.

The correction of digital audio signals at the DSP 120 in the left channel is described in detail with respect to FIG. 2.

At the buffer 111, the data SL(t) of the input L-channel audio signal SLin multiplied by 1 in the sampling period t. At the buffer 112, the data SL(t−1) of the audio signal SLin sampled in the period that is one sampling period before the sampling period t for the data SL(t) is multiplied by −1. The output data of the buffers 111 and 112 are added to each other by the adder 114 to be the data SL(t)−SL(t−1). Accordingly, obtained through these operations is a differential value xL(t) between the current data and data at one sampling before the current data for the input L-channel audio signal SLin.

The differential value xL(t) is supplied to the absolute value circuit 115 that takes an absolute value |xL(t)|. The absolute value |xL(t)| of the differential value xL(t) is amplified by the multiplier A (for example, 0.8) at the multiplier 116 to be data A·|xL(t)|. The data A·|xL(t)| is supplied to the adder 118. Also supplied to the adder 118 is data B·|xR(t)| in the right channel, which is obtained by amplifying an absolute value |xR(t)| of a differential value xR(t) between the current data and data at one sampling before the current data for the input R-channel audio signal SRin by the multiplier B (for example, 0.2) at the multiplier 127. The data A·|xL(t)| and B·|xR(t)| are added to each other by the adder 118 to be data (a correction efficient) A·|xL(t)|+B·|xR(t)|.

The data SL(t) of the input L-channel audio signal SLin is then multiplied by the output data A·|xL(t)|+B·|xR(t)| of the adder 118 at the multiplier 119 so that the level of the data SL(t) is corrected, thus level-corrected data SL(t)·A·|xL(t)|+B·|xR(t)| is output.

These operations are performed for sequential input L-channel digital audio data SL(t), SL(t+1), SL(t+2), . . . , for level corrections or adjustments.

The correction of digital audio signals at the DSP 120 in the right channel is also performed at the elements 123 to 129 (FIG. 2), in the same way as the digital audio signals in the left channel, the level of the data SR(t) of the input R-channel audio signal SRin is corrected based on: the data obtained by multiplying the absolute value |xR(t)| of the differential value xR(t) between the current data and data at one sampling before the current data by the multiplier A (for example, 0.8); and the data obtained by amplifying the absolute value |xL(t)| of the differential value xL(t) for the input L-channel audio signal SRin by the multiplier B (for example, 0.2).

The multipliers A and B (weighting coefficients) may be equal to each other or they may be different from each other, that is, the multiplier A may be larger than the multiplier B, and vise versa. Nevertheless, it is preferable that the multiplier A is larger than the multiplier B. Specific constants (ratios) different between the left and right channels may also be used. The same multiplier A is used for both of the left and right channels. Likewise, the same multiplier B is used for both of the left and right channels.

Through the operations described above, the level-corrected L- and R-channel audio signals SLout and SRout are supplied to the speaker 140, via the DAC 130, that gives off sounds based on the audio signals SLout and SRout.

Discussed next is the absolute value |xL(t)| of the differential value xL(t) and the absolute value |xR(t)| of the differential value xR(t) obtained at the absolute value circuits 115 and 125, respectively.

The absolute value |xL(t)| expresses the change in data amount of the current audio data SL(t) to the audio data SL(t−1) in one sampling period before the current audio data SL(t), in the left channel. Likewise, the absolute value |xR(t)| expresses the change in data amount of the current audio data SR(t) to the audio data SR(t−1) in one sampling period before the current audio data SR(t), in the right channel.

When the change discussed above is positive and large (that is, the sound level rises steeply) for the L-channel audio data SL(t), through the operations described above, the L-channel audio data SL(t) is multiplied by the value obtained by weighted addition to the absolute value |xL(t)| of the differential value xL(t) and the absolute value |xR(t)| of the differential value xR(t). Therefore, the L-channel output sound level increases.

Moreover, when the change discussed above is positive and large (that is, the sound level rises steeply) for the R-channel audio data SR(t), through the operations described above, the R-channel audio data SR(t) is multiplied by the value obtained by weighted addition to the absolute value |xR(t)| of the differential value xR(t) and the absolute value |xL(t)| of the differential value xL(t). Therefore, the R-channel output sound level increases.

When the change discussed above is positive but small (that is, the sound level rises not so steeply), the same operations as described are performed. However, since the absolute values |xL(t)| and |xR(t)| are both small, the output sound level does not increase, or changes little.

The same operation as for the positive and large change described above is also performed when the change discussed above is negative and large, that is, the sound level rises steeply.

Explained next in detail is how an attack sound is emphasized by the attack-sound emphasizing function of the audio reproduction apparatus 1 described above.

Figure 3:
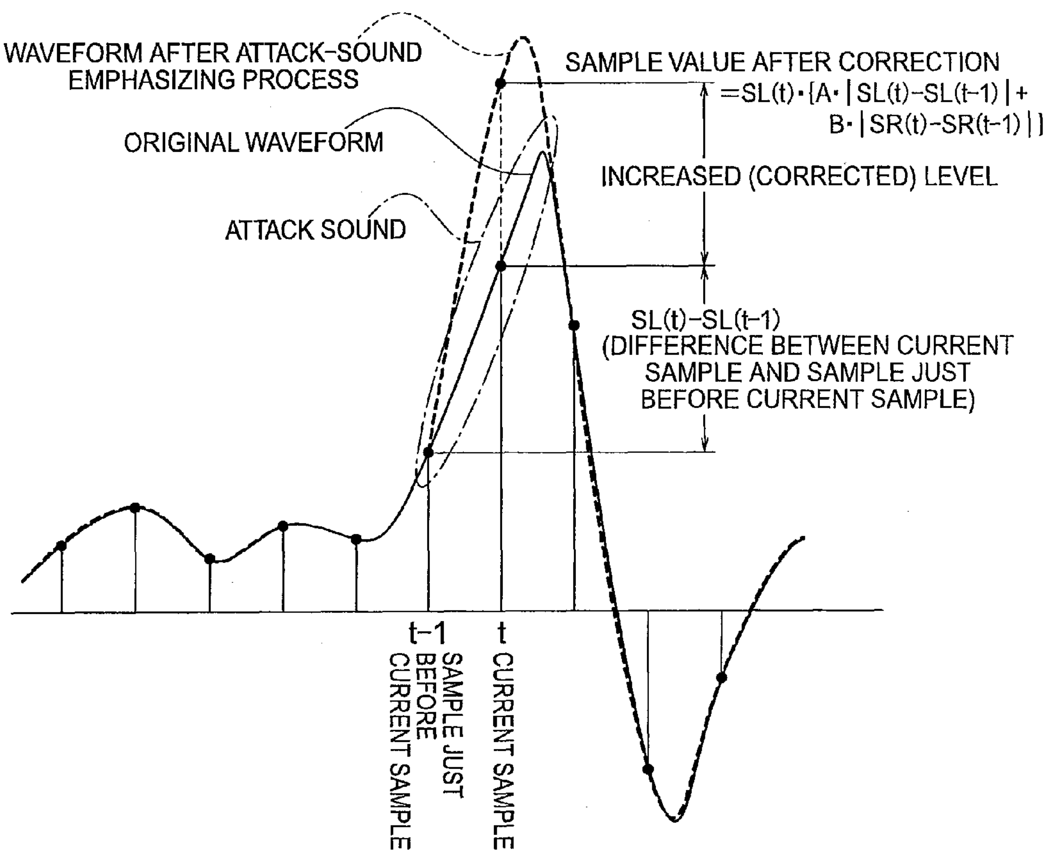
FIG. 3 is a view for explaining an attack-sound emphasizing function of the audio reproduction apparatus shown in FIG. 1.

It is supposed that an original signal having an original waveform indicated by a solid line in FIG. 3 is input to the audio reproduction apparatus 1 in the left channel. It is further supposed that the original signal is a PCM (Pulse Code Modulation) audio signal decoded by an MP-3 decoder from lossy-compressed audio data compressed by MP3, having high-frequency components cut and dynamics lost.

With the attack-sound emphasizing function of the DSP120, as described above, a differential value SL(t)−SL(t−1) is obtained for a signal level SL(t) in the current sampling period t and a signal level SL(t−1) in a sampling time t−1 just before the current sampling period t. Then, the sampled value in the current sampling period t is corrected to be a corrected sampled value $SL(t)\cdot\{A\cdot|SL(t)-SL(t-1)|+B\cdot|SR(t)-SR(t-1)|\}$, as described above. With the processing, the sampled value in the current sampling period t is increased as shown in FIG. 3. Then, audio data having the corrected sampled value is output to the DAC130 from the DSP 120. Accordingly, the original waveform indicated by the solid line in FIG. 3 is changed to an analog waveform obtained by the attack-sound emphasizing function and indicated by a broken line, having an attack sound emphasized. The analog waveform having the attack sound emphasized is output the speaker 140 that gives off a sharp and dynamic attack sound.

Explained next is how much an attack sound is emphasized by the attack sound emphasizing function of the audio reproduction apparatus 1 described above.

Figure 4:
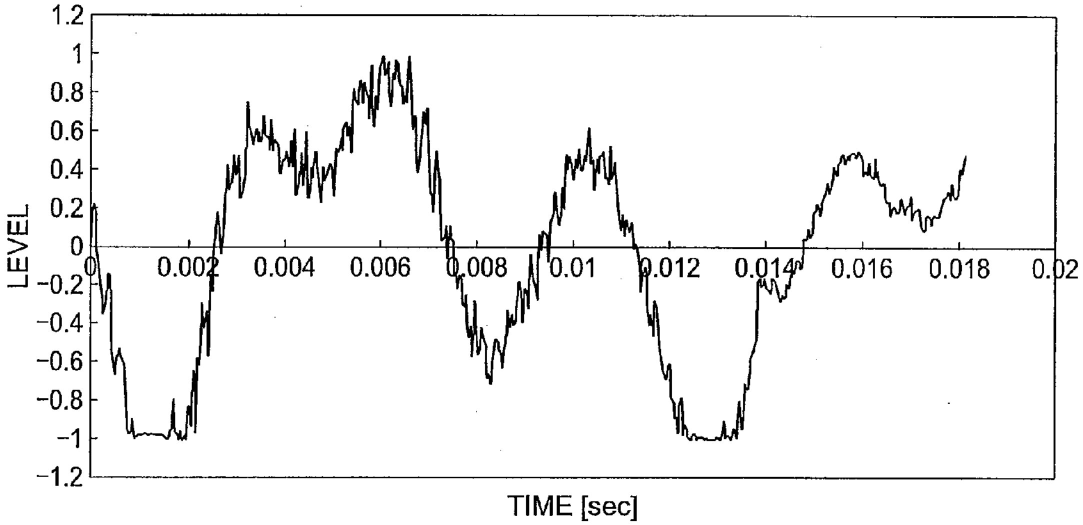
FIG. 4 is an exemplary view of an audio signal output from a decoder of the audio reproduction apparatus shown in FIG. 1.
Figure 5:
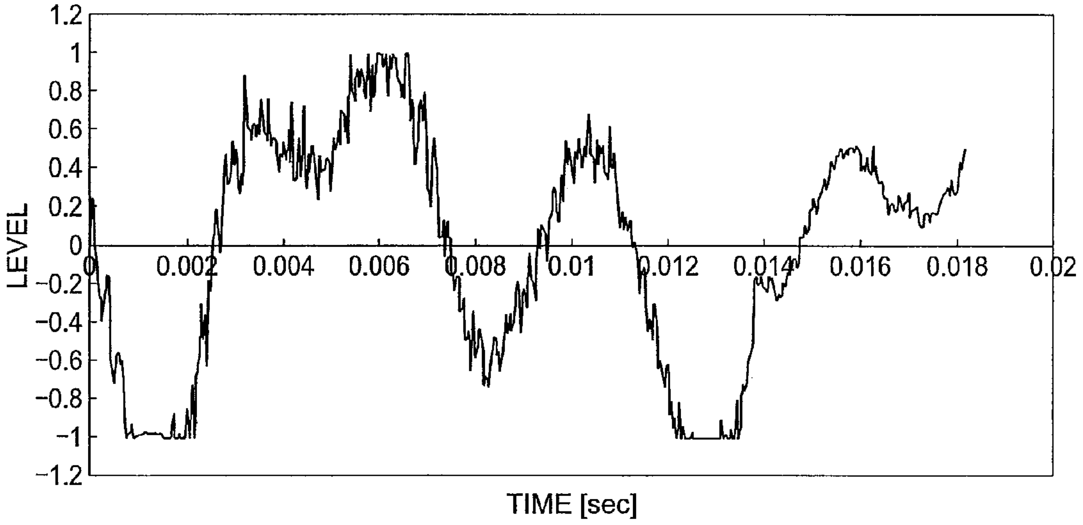
FIG. 5 is an exemplary view of an audio signal output from a DSP of the audio reproduction apparatus shown in FIG. 1.

FIG. 4 shows an example of audio signals continuously output from the decoder 110, with the time (sec) and level on the abscissa and ordinate, respectively. FIG. 5 shows audio signals continuously output from the DSP120 in response to the audio signals of FIG. 4, with the time (sec) and level on the abscissa and ordinate, respectively.

Figure 6:
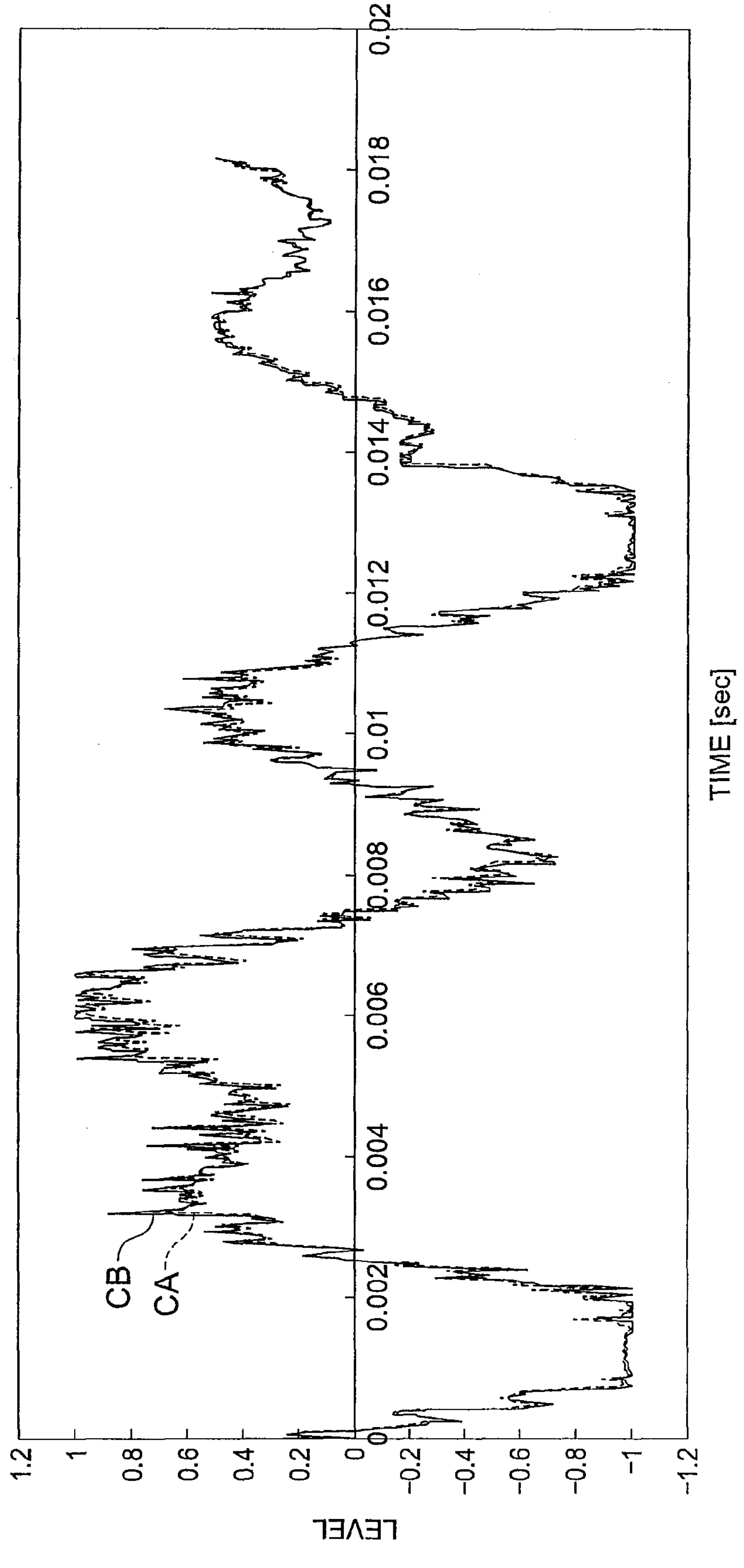
FIG. 6 is a view in which a view of FIG. 4 is superimposed on that of FIG. 5.

FIG. 6 is a view in which a view of FIG. 4 is superimposed on that of FIG. 5, with a curve CA (indicated by a broken line) indicating the audio signals output from the decoder 110 and a curve CB (indicated by a solid line) indicating the audio signals output from the DSP120. It is understood from FIG. 6 that specific data having a level increased very much with respect to data one sampling period before the specific data is corrected to have a level increased further.

As described above, according to the audio reproduction apparatus 1, the embodiment of the present invention, an attack sound having a sound level rising up steeply and a volume varying instantaneously is reproduced as a sharper and clearer attack sound having a sound level rising up steeply.

Moreover, the audio reproduction apparatus 1, the embodiment of the present invention, has the following advantages: The DSP120 is not equipped with filters which would otherwise cause phase delay or error, thus achieving real-time correction of audio signals with very light load processing. The DSP120 performs the correction to raise the level higher for a sound with a steeper rising level, thus outputting a corrected sound that does not give an adverse effect to the characteristics of the speaker 140, such as conversion loss. The DSP120 is not equipped with feedback circuits which would otherwise cause oscillation, thus outputting sounds of stable levels. The DSP120 corrects audio signals not based on the level difference in either the left or right channel but based on the level difference in both of the left and right channels. Therefore, the levels of the audio signals rise instantaneously with almost no movement of sound image between the left and right channels, thus the reproduction of a real attack sound is achieved.

As described above in detail, according to the audio reproduction apparatus 1, the embodiment of the present invention, an attack sound portion of an audio signal is corrected to have a waveform closer to an original sound (an original audio signal). Therefore, a shaper, clearer and more realistic attack sound that is closer to the original sound can be reproduced.

(Variation to Audio Reproduction Apparatus)

Described next is a variation to the audio reproduction apparatus 1, the embodiment of the present invention.

An audio reproduction apparatus 2, a variation of the present invention, is provided with a sound source 100, a decoder 110, a DSP 120*a*, a DAC 130, and a speaker 140, connected to one another in the same manner as the audio reproduction apparatus 1 shown in FIG. 1, with the same reference numerals given to the same or analogous elements as those of FIG. 1.

Figure 7:
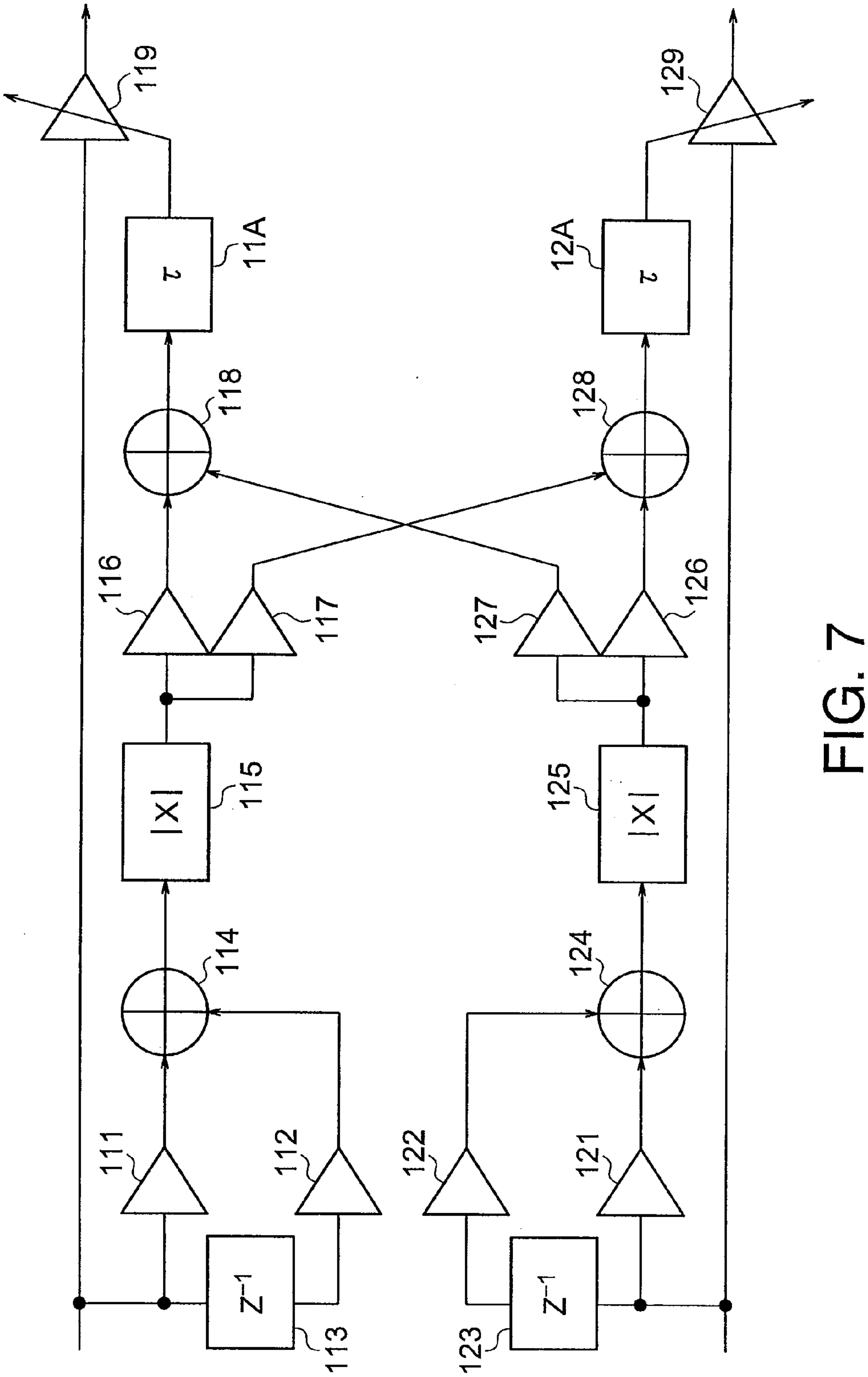
FIG. 7 is an exemplary block diagram of a DSP of the audio reproduction apparatus shown in FIG. 1.

Different from the DSP 120 of the audio reproduction apparatus 1 shown in FIG. 2, the DSP 120*a* of the audio reproduction apparatus 2 is equipped with time constant circuits 11A and 12A as shown in FIG. 7, with the same reference numerals given to the same or analogous elements as those of FIG. 2.

In detail, as shown in FIG. 7, the time constant circuit 11A is provided between the adder 118 and the multiplier 119 in the left channel and the time constant circuit 12A is provided between the adder 128 and the multiplier 129. The time constant circuit 11A receives the output signal of the adder 118, varies the response speed of the output signal, and outputs a signal with a varied response speed to the multiplier 119. The time constant circuit 12A receives the output signal of the adder 128, varies the response speed of the output signal, and outputs a signal with a varied response speed to the multiplier 129.

In the case of adjusting the response speed to be slower, the time constant circuits 11A and 11B may delay or integrate the input signal, or suppress high-frequency components of the input signal.

Although the operation of the audio reproduction apparatus 2 is basically the same as the audio reproduction apparatus 1, the audio reproduction apparatus 2 can vary the speed of rise-up (the response speed) of a signal, that is, the dynamic characteristics of a signal. In other words, when a level difference between differential values xL(t) and xR(t) is large, the audio reproduction apparatus 2 starts the correction of audio signals at the time of detecting the large level difference and gradually decreases the degree of the correction over a specific period.

The time constants of the time constant circuits 11A and 11B are adjusted to vary the response speed of a signal, which has the following advantages and disadvantages: The smaller the time constant to increase the response speed, the steeper the rise of a signal, which is advantageous in adequately outputting a sound with rapid change, such as a attack sound, whereas disadvantageous in lower sound reproducibility. On the other hand, the larger the time constant to decrease the response speed, the slower the rise of a signal, which is disadvantageous in inadequately outputting a sound with rapid change, such as a attack sound, whereas advantageous in higher sound reproducibility.

The sound reproducibility discussed above is defined as follows: The sound reproducibility is low when a sound is processed only at the point at which the sound level rises, with the continuity between the processed sound and the next sound after the process being not smooth and hence not natural when given off by the speaker 140. On the other hand, the sound reproducibility is high when a sound at the point at which the sound level rises and the next sound are processed, with the continuity between the processed sounds being smooth and hence natural when given off by the speaker 140.

Figure 8:
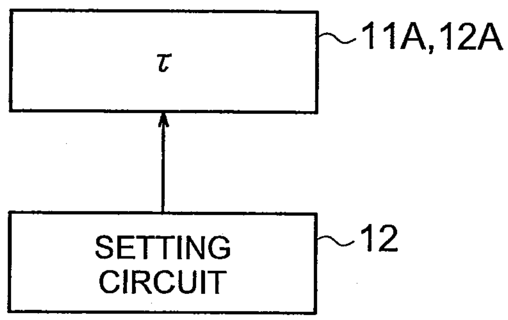
FIG. 8 is an exemplary block diagram of circuitry for setting a time constant τ.

The audio reproduction apparatus 2 may be equipped with a setting circuit 12 for adjusting a time constant $\tau$ of the time constant circuits 11A and 11B, as shown in FIG. 8. The time constant $\tau$ may be set by user input or may be set to a value corresponding to a user ID input by a user. Or the time constant $\tau$ may be set to a value corresponding to genre information carried by a reproduced signal supplied from the sound source 100.

As described above, the variation to the audio reproduction apparatus 2 allows a user to set the response speed to any value in accordance with how much high-frequency components have been cut off or with a user's favorite genre of music.

(Embodiment of Audio Reproduction Method and Program)

Described above are the embodiment of audio reproduction apparatus and its variations equipped with the DSP 120 (120*a*) having the attack-sound emphasizing function. Not only by the DSP 120, the attack sound emphasizing function can be achieved with an ordinary processor (CPU) that executes a program for a process which will be described blow. The program is preferably stored in a storage medium, such as a RAM or ROM implemented with the CPU in an audio reproduction apparatus.

An audio reproduction apparatus in this case has the circuit configuration the same as that of FIG. 1, except for the CPU in place of the DSP120.

Figure 9:
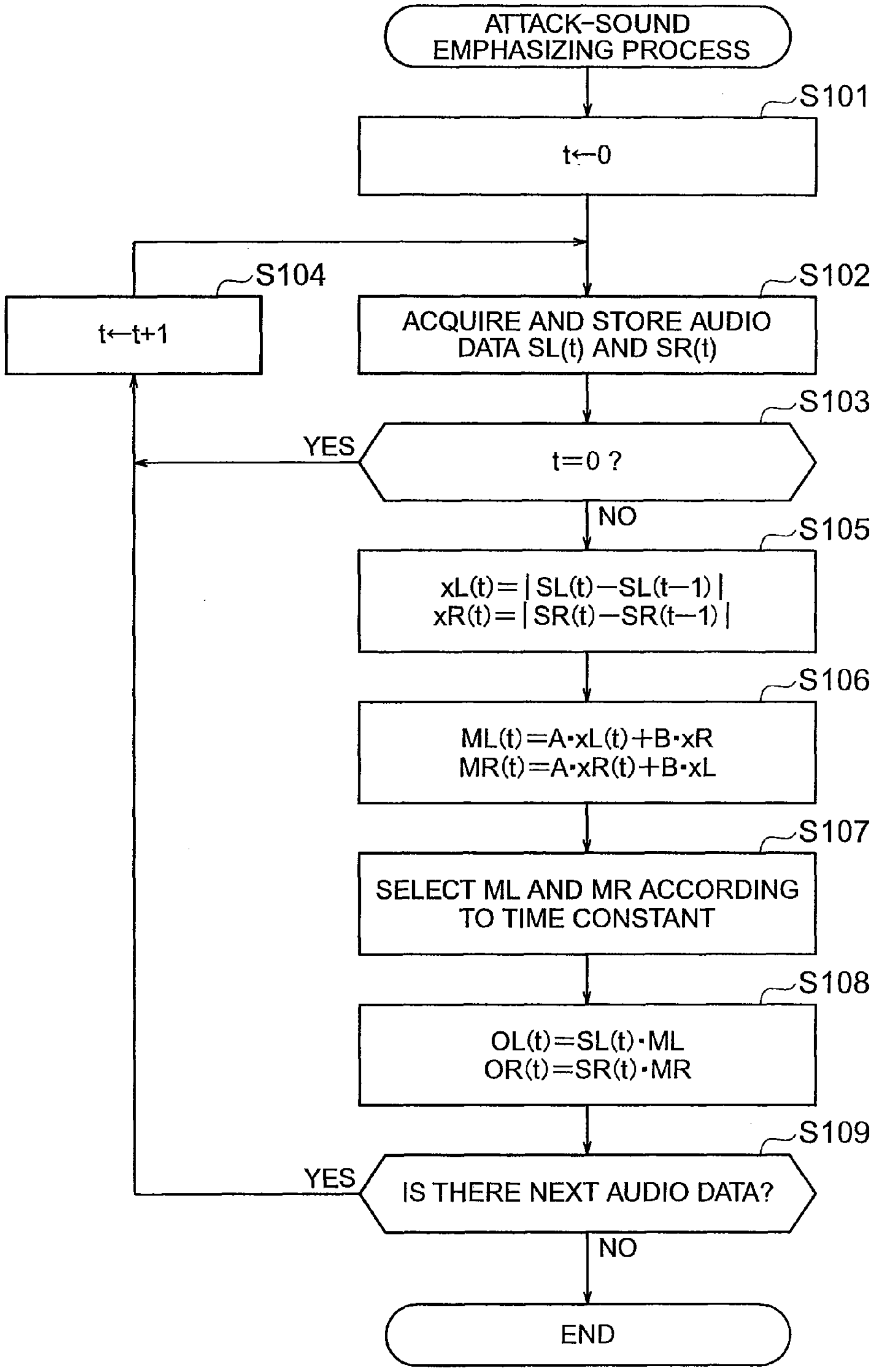
FIG. 9 is a flow chart explaining an embodiment of a method or a program for attack-sound emphasis according to the present invention.

An attack-sound emphasizing process executed by the CPU is explained with reference to FIG. 9.

Firstly, a variable t that indicates a sampling period is substituted with zero, in step S101. Next, audio signals SL(t) and SR(t) in the left and right channels, respectively, are input and stored associated with the variable t, in step S102. It is then determined whether the variable t is zero, in step S103.

If it is determined that the variable t is zero (Yes in step S103), there is only one piece of audio data for each of the left and right channels, and hence the differential values xL(t) and xR(t) cannot be obtained. Therefore, the variable t is incremented by +1 in step S104 and then the process retunes to step S102 to repeat the steps described above.

On the other hand, if it is determined that the variable t is not zero (No in step S103), $xL(t)=|SL(t)-SL(t-1)|$ and $xR(t)=|SR(t)-SR(t-1)|$ are calculated in the left and right channels, in step S105, that are the absolute vales of a differential value between current audio data SL(t) and audio data SL(t−1) obtained in one sampling period before the data SL(t) and a differential value between current audio data SR(t) and audio data SR(t−1) obtained in one sampling period before the data SR(t), respectively.

The absolute vales in the left and right channels are combined to obtain multipliers $ML(t)=A\cdot xL(t)+B\cdot xR$ and $MR(t)=A\cdot xR(t)+B\cdot xL$ which are then stored, in step S106. Next, in step S107, multipliers are selected from among the obtained multipliers according to the time constant $\tau$. For example, if the time constant $\tau$ corresponds to n sampling periods, selected are multipliers ML(t−n) and MR(t−n).

The input audio data SL(t) and SR(t) are then multiplied by the selected multipliers ML(t) and MR(t), respectively, to obtain output signals OL(t) and OR(t), in step S108.

It is then determined whether there is audio data in the next sampling period, in step S109.

If it is determined that there is audio data in the next sampling period (Yes in step S109), the process returns to step S102 to repeat the steps described above. On the other hand, if it is determined that there is no audio data in the next sampling period (No in step S109), the attack-sound emphasizing process ends.

With the attack-sound emphasizing process described above, the correction of sounds having attack sounds emphasized that have been deteriorated due to lossy-compressed can be performed.

In the description above, a differential value between two pieces of audio data appearing one after another is obtained for acquiring the change in audio signals SL and SR in the left and right channels, respectively. However, not only the differential value between two pieces of audio data appearing one after another, any value can be obtained in this invention as far as substantial differential values that represent the change in audio signals SL and SR in the left and right channels, respectively, can be obtained.

For example, an audio signal may be corrected with the acquisition of differential values between current audio data and audio data one sampling period before, the current audio data and audio data two sampling periods before, . . . , and the current audio data and audio data n sampling periods before, through a plurality (n) of stages of delay elements, in each of the left and right channels.

The correction with the acquisition of differential values through n pieces of audio data can be achieved, in FIG. 2, with an n number of delay elements 113 sequentially provided in the left channel. In this case, the adder 114 outputs $xL(t)=W1\cdot\{SL(t)-SL(t-1)\}+W2\cdot\{SL(t-1)-SL(t-2)\}+ \ldots +Wn\cdot\{SL(t-n+1)-SL(t-n)\}$. Or the adder 114 may output $xL(t)=W1\cdot\{SL(t)-SL(t-1)\}+W2\cdot\{SL(t1)-SL(t-2)\}+ \ldots +Wn\cdot\{SL(t)-SL(t-n)\}$. W1 to Wn are weights which can be set freely. Moreover, the adder 114 may obtain $\Sigma ij\cdot\{(SL(t-i)-SL(t-j)\}$ ($i=0$ to $n+1$, $j=1$ to $n$, $i<j$). The same is applied to the right channel.

Moreover, the average or maximum value of differential values between current audio data and audio data one sampling period before, the current audio data and audio data two sampling periods before, . . . , and the current audio data and audio data n sampling periods before may be used as the differential value x for the correction of audio signals.

In FIGS. 2 and 7, the absolute value circuits 115 and 125 may be omitted.

In the above description, input audio signals are multiplied by multipliers that are correction coefficients obtained by the adders 118 and 128. The multipliers may be a value obtained by applying some factors to the correction coefficients. For example, the multipliers may be obtained by adding a specific bias value to the correction coefficients.

Moreover, a switching circuit may be provided to: determine whether audio data supplied from the sound source 100 (FIG. 1) is lossy-compressed audio data and turn on the attack-sound emphasizing function explained with reference to FIG. 2 or 7 (or supplies the audio data to the attack-sound emphasizing circuit of FIG. 2 or 7) when determined that the audio data is lossy-compressed data; whereas, if not, turn off the attack-sound emphasizing function (or not supply the audio data to the attack-sound emphasizing circuit).

Furthermore, a program running on a computer to achieve the attack-sound emphasizing function described with respect to FIG. 2 or 7 (or the process described with respect to FIG. 9) may be retrieved from a storage medium (a flexible disc, a CD-ROM, a DVD-ROM, etc.). Or the program may be transferred from a storage medium of a server on a communication network, such as the Internet, and installed in a computer.

Moreover, the attack-sound emphasizing function or process may be achieved with OS (Operating System) and an application program that is stored in a storage medium or apparatus.

Furthermore, the program running on a computer to achieve the attack-sound emphasizing function or process may be carried by a carrier wave and delivered over a communication network. In this case, the program may be posted on BBS (Bulletin Board System) on a communication network. The program is then delivered or downloaded over the network to a computer that executes the program like other application programs under control by the OS to perform the attack-sound emphasizing function or process.

As described above in detail, the present invention achieves the correction of an audio signal that involves an attack sound deteriorated due to digitalization or compression into an audio signal close to an original audio signal.

It is further understood by those skilled in the art that the foregoing description is a preferred embodiment of the disclosed device or method and that various changes and modifications may be made in the invention without departing from the spirit and scope thereof.

What is claimed is:

1. An audio signal correction apparatus comprising:

a first differential-value acquisition circuit including:

a first buffer configured to multiply a first input digital stereo audio signal in a left channel by 1 to output a first digital stereo audio signal multiplied by 1;

a first delay element configured to delay the first input digital stereo audio signal by a specific number of sampling periods to output a delayed first digital stereo audio signal;

a second buffer configured to multiply the delayed first digital stereo audio signal by −1 to output a delayed first digital stereo audio signal multiplied by −1; and a first adder configured to add the first digital stereo audio signal multiplied by 1 and the delayed first digital audio signal multiplied by −1 to acquire a first differential value;

a second differential-value acquisition circuit including:

a third buffer configured to multiply a second input digital stereo audio signal in a right channel by 1 to output a second digital audio signal multiplied by 1;

a second delay element configured to delay the second input digital stereo audio signal by a specific number of sampling periods to output a delayed second digital stereo audio signal;

a fourth buffer configured to multiply the delayed second digital stereo audio signal by −1 to output a delayed second digital stereo audio signal multiplied by −1; and a second adder configured to add the second digital stereo audio signal multiplied by 1 and the delayed second digital stereo audio signal multiplied by −1 to acquire a second differential value;

a correction coefficient acquisition circuit including:

a first multiplier and a second multiplier configured to amplify the first differential value at a first specific ratio;

a third multiplier and a fourth multiplier configured to amplify the second differential value at a second specific ratio;

a third adder configured to add the first differential value amplified by the first multiplier and the second differential value amplified by the third multiplier to acquire a first correction coefficient; and a fourth adder configured to add the first differential value amplified by the second multiplier and the second differential value amplified by the fourth multiplier to acquire a second correction coefficient; and a correction circuit including a fifth multiplier configured to correct the first input digital audio signal by multiplying the first input digital audio signal by the first correction coefficient and a sixth multiplier configured to correct the second input digital audio signal by multiplying the second input digital audio signal by the second correction coefficient, wherein the first and second differential-value acquisition circuits have absolute-value circuits for taking absolute values of the first and second differential values, respectively, wherein the first and second multipliers amplify the absolute value of the first differential value at the first specific ratio, and the third and fourth multipliers amplify the absolute value of the second differential value at the second specific ratio.

2. The audio signal correction apparatus according to claim 1, wherein the correction coefficient acquisition circuit acquires the first correction coefficient by weighted addition at the first ratio at which the first differential value is more weighted than the second differential value and acquires the second correction coefficient by weighted addition at the second ratio at which the second differential value is more weighted than the first differential value.

3. The audio signal correction apparatus according to claim 1 further comprising a time-constant circuit configured to delay a first signal output from the third adder and carrying the first correction coefficient by a first specific constant and a second time-constant circuit configured to delay a second signal output from the fourth adder and carrying the second correction coefficient by a second specific constant, wherein the fifth multiplier multiplies the first input digital audio signal by the first correction coefficient carried by the delayed first signal, thereby correcting the first input digital audio signal, and the sixth multiplier multiplies the second input digital audio signal by the second correction coefficient carried by the delayed second signal, thereby correcting the second input digital audio signal.

4. An audio signal correction method comprising:

a first differential-value acquisition step of:

multiplying a first input digital stereo audio signal in a left channel by 1 to output a first digital stereo audio signal multiplied by 1;

delaying the first input digital stereo audio signal by a specific number of sampling periods to output a delayed first digital stereo audio signal;

multiplying the delayed first digital stereo audio signal by −1 to output a delayed first digital stereo audio signal multiplied by −1; and adding the first digital stereo audio signal multiplied by 1 and the delayed first digital stereo audio signal multiplied by −1, thereby acquiring a first differential value;

a second differential-value acquisition step of:

multiplying a second input digital stereo audio signal in a right channel by 1 to output a second digital stereo audio signal multiplied by 1;

delaying the second input digital stereo audio signal by a specific number of sampling periods to output a delayed second digital stereo audio signal;

multiplying the delayed second digital stereo audio signal by −1 to output a delayed second digital stereo audio signal multiplied by −1; and adding the second digital stereo audio signal multiplied by 1 and the delayed second digital stereo audio signal multiplied by −1, thereby acquiring a second differential value;

a correction coefficient acquisition step of:

amplifying the first differential value at a first specific ratio to output a third differential value and a fourth differential value;

amplifying the second differential value at a second specific ratio to output a fifth differential value and a sixth differential value;

adding the third differential value and the fifth differential value, thereby acquiring a first correction coefficient; and adding the fourth differential value and the sixth differential value, thereby acquiring a second correction coefficient; and a correction step of correcting the first input digital audio signal by multiplying the first input digital audio signal by the first correction coefficient and correcting the second input digital audio signal by multiplying the second input digital audio signal by the second correction coefficient, wherein the first and second differential-value acquisition circuits have absolute-value circuits for taking absolute values of the first and second differential values, respectively, wherein the first and second multipliers amplify the absolute value of the first differential value at the first specific ratio, and the third and fourth multipliers amplify the absolute value of the second differential value at the second specific ratio.

5. The audio signal correction method according to claim 4, wherein the correction coefficient acquisition step includes a step of acquiring the first correction coefficient by weighted addition at the first ratio at which the first differential value is more weighted than the second differential value and acquiring the second correction coefficient by weighted addition at the second ratio at which the second differential value is more weighted than the first differential value.

6. The audio signal correction method according to claim 4 further comprising a step of delaying a first signal carrying the first correction coefficient by a first specific constant and delaying a second signal carrying the second correction coefficient by a second specific constant, wherein, in the correction step, the first input digital audio signal is multiplied by the first correction coefficient carried by the delayed first signal, thereby correcting the first input digital audio signal, and the second input digital audio signal is multiplied by the second correction coefficient carried by the delayed second signal, thereby correcting the second input digital audio signal.

7. An audio signal correction program stored in a non-transitory computer readable device, the program comprising:

a first differential-value acquisition program code of:

multiplying a first input digital stereo audio signal in a left channel by 1 to output a first digital stereo audio signal multiplied by 1;

delaying the first input digital stereo audio signal by a specific number of sampling periods to output a delayed first digital stereo audio signal;

multiplying the delayed first digital stereo audio signal by −1 to output a delayed first digital stereo audio signal multiplied by −1; and adding the first digital stereo audio signal multiplied by 1 and the delayed first digital stereo audio signal multiplied by −1, thereby acquiring a first differential value;

a second differential-value acquisition program code of:

multiplying a second input digital stereo audio signal in a right channel by 1 to output a second digital stereo audio signal multiplied by 1;

delaying the second input digital stereo audio signal by a specific number of sampling periods to output a delayed second digital stereo audio signal;

multiplying the delayed second digital stereo audio signal by −1 to output a delayed second digital stereo audio signal multiplied by −1; and adding the second digital stereo audio signal multiplied by 1 and the delayed second digital stereo audio signal multiplied by −1, thereby acquiring a second differential value;

a correction coefficient acquisition program code of:

amplifying the first differential value at a first specific ratio to output a third differential value and a fourth differential value;

amplifying the second differential value at a second specific ratio to output a fifth differential value and a sixth differential value;

adding the third differential value and the fifth differential value, thereby acquiring a first correction coefficient; and adding the fourth differential value and the sixth differential value, thereby acquiring a second correction coefficient; and a correction program code of correcting the first input digital audio signal by multiplying the first input digital audio signal by the first correction coefficient and correcting the second input digital audio signal by multiplying the second input digital audio signal by the second correction coefficient, wherein the first and second differential-value acquisition circuits have absolute-value circuits for taking absolute values of the first and second differential values, respectively, wherein the first and second multipliers amplify the absolute value of the first differential value at the first specific ratio, and the third and fourth multipliers amplify the absolute value of the second differential value at the second specific ratio.

8. The audio signal correction program according to claim 7, wherein the correction coefficient acquisition program code includes a program code of acquiring the first correction coefficient by weighted addition at the first ratio at which the first differential value is more weighted than the second differential value and acquiring the second correction coefficient by weighted addition at the second ratio at which the second differential value is more weighted than the first differential value.

9. The audio signal correction program according to claim 7 further comprising a program code of delaying a first signal carrying the first correction coefficient by a first specific constant and delaying a second signal carrying the second correction coefficient by a second specific constant, wherein, in the correction program code, the first input digital audio signal is multiplied by the first correction coefficient carried by the delayed first signal, thereby correcting the first input digital audio signal, and the second input digital audio signal is multiplied by the second correction coefficient carried by the delayed second signal, thereby correcting the second input digital audio signal.

* * * * *